United States Patent [19]
Dully

[11] B 3,981,073
[45] Sept. 21, 1976

[54] LATERAL SEMICONDUCTIVE DEVICE AND METHOD OF MAKING SAME

[75] Inventor: Joseph H. Dully, Cupertino, Calif.

[73] Assignee: Varian Associates, Palo Alto, Calif.

[22] Filed: July 26, 1974

[21] Appl. No.: 492,301

[44] Published under the second Trial Voluntary Protest Program on January 13, 1976 as document No. B 492,301.

Related U.S. Application Data

[62] Division of Ser. No. 372,464, June 21, 1973, abandoned.

[52] U.S. Cl. .................................... 29/580; 29/591; 357/3
[51] Int. Cl.² .......................................... B01J 17/00
[58] Field of Search ................. 29/580, 576 E, 590, 29/591; 357/3

[56] References Cited
UNITED STATES PATENTS

| | | | |
|---|---|---|---|
| 2,748,041 | 5/1956 | Leverenz | 29/580 |
| 3,381,182 | 4/1968 | Thornton | 29/576 E |
| 3,820,236 | 6/1974 | Haitz | 29/580 |

Primary Examiner—W. Tupman
Attorney, Agent, or Firm—Stanley Z. Cole; Robert K. Stoddard; Richard B. Nelson

[57] ABSTRACT

A lateral semiconductive device, such as a Gunn device or Impatt diode, is fabricated by depositing a barrier layer of beryllia over an epitaxial grown layer of N— type semiconductive material on an N+ type semiconductive wafer. The wafer is then thinned down, as by grinding and polishing. Electrode material is then deposited overlaying the N+ wafer layer for making ohmic contact thereto. The electrode material is etched to define at least a pair of laterally spaced electrodes, each making electrical connection to the epitaxial N— layer via the intervening layer of N+ wafer material. In the case of a Gunn device, the insulative barrier layer provides electrical insulation and prevents undesired leakage of current. In addition, it serves as a barrier to prevent metallic contact materials from diffusing into the epitaxial N— layer. Further, it serves as a heat sink between the active device and its mount. The electrode contacts are improved by their ohmic contact to the N+ wafer material on which the epitaxial N— active layer is grown.

9 Claims, 5 Drawing Figures

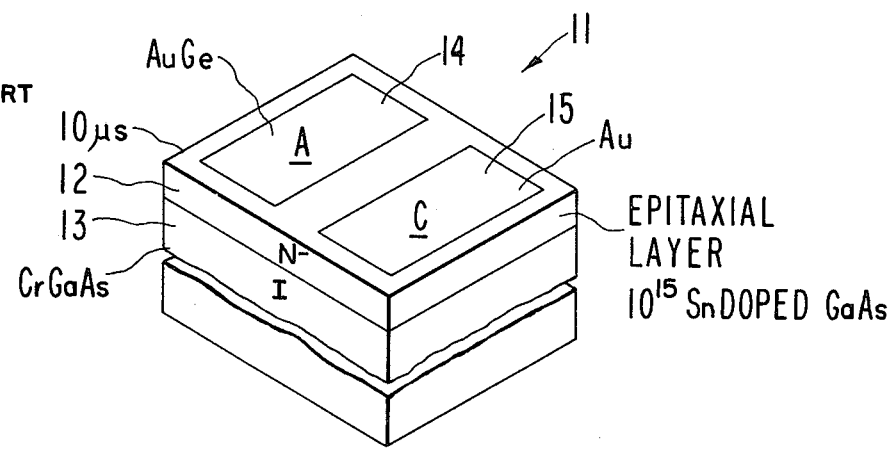
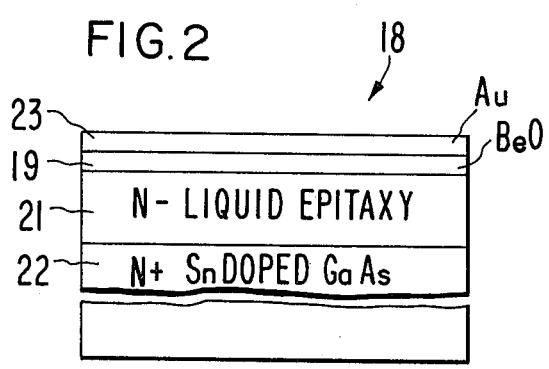
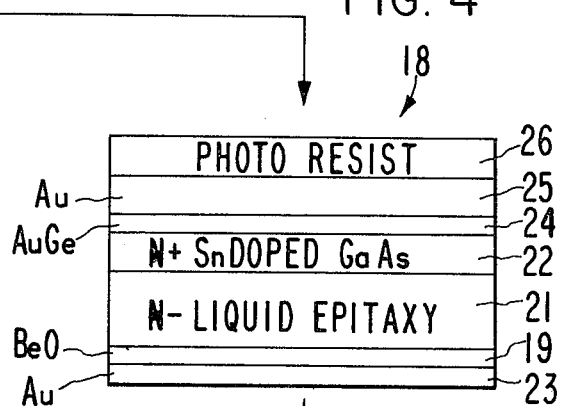
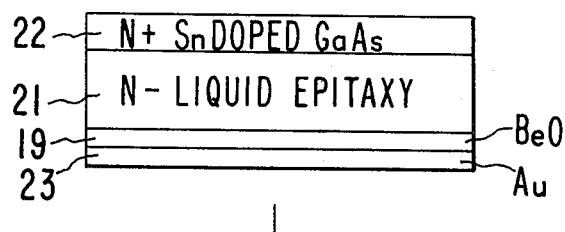
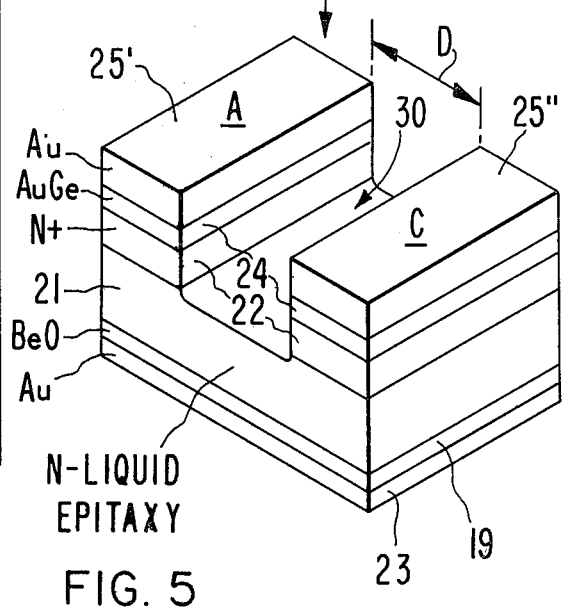

3,981,073

LATERAL SEMICONDUCTIVE DEVICE AND METHOD OF MAKING SAME

This is a division of application Ser. No. 372,464 filed June 21, 1973, now abandoned.

BACKGROUND OF THE INVENTION

The present invention relates in general to methods of making lateral semiconductive devices and more particularly to an improved method for making lateral type Gunn and Impatt devices useful as high power microwave oscillators.

DESCRIPTION OF THE PRIOR ART

Heretofore, lateral Gunn devices have been fabricated by growing an epitaxial layer of N− material, such as tin doped gallium arsenide having a tin doping concentration of $10^{15}$ atoms per cubic centimeter, upon a semi-insulating chromium doped gallium arsenide substrate wafer. Laterally spaced gold-germanium anode and cathode electrodes were deposited upon the N− epitaxial layer such that a Gunn device was formed by that portion of the epitaxial layer between the laterally spaced anode and cathode electrodes.

The problem with this prior art Gunn oscillator was that some leakage current was found to pass between anode and cathode through the underlying wafer layer. In addition, the anode was sometimes destroyed by current avalanche at the junction with the epitaxial layer, rendering the device inoperative.

Thus it is desired to provide an improved lateral Gunn device and method of fabricating same.

SUMMARY OF THE PRESENT INVENTION

The principal object of the present invention is the provision of an improved lateral semiconductive device and method of making same.

In one feature of the present invention, a barrier layer of electrically insulative material such as beryllia is deposited overlaying and interfacing with an epitaxial layer grown upon the semiconductive wafer. The wafer is then thinned down, as by polishing or grinding, and laterally spaced electrodes are formed overlaying the thinned down wafer. In this manner, the active region of the epitaxial layer is precisely controlled to avoid undesired leakage current and improved electrical contact is obtained to the active epitaxial layer.

In another feature of the present invention, the wafer material is N+ doped material and the active layer is epitaxial N− doped semiconductive material.

In another feature of the present invention, the wafer and epitaxial layers are made of a material selected from the group consisting of gallium arsenide and indium phosphide.

Other features and advantages of the present invention will become apparent upon a perusal of the following specification taken in connection with the accompanying drawings wherein:

BRIEF DESCRIPTION OF THE DRAWINGS

FIG. 1 is a simplified perspective view of a prior art Gunn device,

FIG. 2 is a simplified vertically foreshortened side view of a semiconductive device of the present invention in an intermediate step of manufacture, FIG. 3 is a view similar to that of FIG. 2 showing the semiconductive device in a subsequent stage of manufacture, FIG. 4 is a view similar to that of FIG. 3 depicting the semiconductive device of the present invention in a subsequent stage of manufacture, and FIG. 5 is a perspective view of a Gunn device of the present invention.

DESCRIPTION OF THE PREFERRED EMBODIMENTS

Referring now to FIG. 1, there is shown the prior art Gunn device 11 fabricated according to the prior art method. More particularly, an epitaxial N− layer 12 as of 0.1 to 10 microns thickness of tin doped gallium arsenide is grown, as by liquid epitaxy, onto an instrinsic wafer 13 of chromium doped gallium arsenide. In a typical example, the epitaxial layer 12 is of N− conductivity having a donor tin dopant concentration of approximately $10^{15}$ atoms per cubic centimeter. A pair of laterally spaced gold and germanium electrodes 14 and 15 are deposited, as by vacuum evaporation, upon the face of the epitaxial layer 12.

In a typical example, electrode 14 served as the anode and electrode 15 as the cathode with the spacing between the electrodes being approximately 10 microns. The distance between anode and cathode, 14 and 15 respectively, determine the transit time and thus the operating frequency range of the Gunn oscillator device 11 in accordance with well known principles. A conventional vertical type Gunn device and method of fabricating same is disclosed in U.S. Pat. No. 3,537,919, issued Nov. 3, 1970.

The problem with the prior art lateral Gunn device 11 is that avalanche current flow effects often occurred at the anode electrode 14, thereby destroying the electrode and rendering the device inoperative. In addition, leakage current between anode and cathode was found to flow through the substrate wafer 13 near the interface of the epitaxial layer 12 with the wafer layer 13, thereby degrading the efficiency of the device.

Referring now to FIG. 2, there is shown a semiconductive wafer structure 18 in an intermediate state of manufacture according to the method of the present invention. More particularly, a barrier layer 19 of beryllia is deposited to a thickness of between 0.5 and 20 microns upon the polished face of an N− liquid phase epitaxial layer 21 as grown to a thickness between 0.20 and 50 microns upon an N+ tin doped substrate wafer 22 of gallium arsenide. In a typical example, the wafer 22 has a thickness of 75 microns and is doped with tin to a dopant concentration of donor carriers on the order of $10^{18}$ per cubic centimeter. Such substrates are commercially available from Monsanto or Bell and Howell. The (100) crystallographic axis is normal to the surface forming the interface between the epitaxial layer 21 and the wafer 22.

The surface of the N− type liquid epitaxial layer 21, onto which the beryllia is to be deposited, as by RF sputter deposition, is polished with 1 micron diamond dust in a suitable polishing slurry applied with a polishing cloth. After the surface has been polished, the surface is rinsed with an etchant of $Br_2CH_3OH$ which serves to remove work damage done by the diamond polish. The beryllia layer 19 is then deposited on the polished face as by RF sputtering. A layer of gold 23 having a thickness of about 1,000 angstroms is then sputter deposited overlaying the beryllia layer 19.

The structure 18 is then inverted such that the wafer can be ground and polished on the N+ substrate side. More particularly, the structure 18 is mounted by wax onto a quartz plug and the wafer layer 22 is then ground and polished to take off approximately 65 microns of the original 75 microns thickness to leave a remaining wafer layer 22 of a thickness of approximately 10 to 20 microns. The resultant structure 18 is shown in FIG. 3.

Referring now to FIG. 4, a gold germanium eutectic consisting of approximately 88% gold and 12% germanium is then RF sputter deposited onto the N+ water layer 22 to a thickness of approximately 0.5 micron. Nickel is then evaporated overlaying the gold germanium eutectic to a thickness of approximately 1,000 angstroms. The eutectic and nickel layers on the wafer are then alloyed by raising the temperature of the structure, in a hydrogen furnace, to a temperature of between 425° and 450°C for 15 seconds.

Next, the wafer 18 is electroplated with "Sel Rex pure gold" having a purity of 99.9% to a thickness suitable for ultrasonic bonding or soldering with an indium layer having a thickness of 1.5 to 5 microns. The electroplated gold is applied to opposite sides of the device 18 such that both the newly formed layer 25 and the original layer 23 have approximately the same thickness, namely, 1.5 to 5 microns.

A photoresist layer 26 of conventional type is then centrifugally spun onto the gold layer 25 and exposed in the conventional manner to define two laterally spaced protective regions for the electrode structure.

Referring now to FIG. 5, the photoresist layer 26 is developed by conventional techniques to expose the area intermediate the laterally spaced electrode portions 25' and 25''. The gold germanium layers are then etched with a suitable etchant, such as an aqueous solution containing 50 grams of potassium iodide and 20 grams of iodine in 100 milliliters of water. The wafer layer 22 is then etched down to the epitaxial layer 21 with a suitable etchant comprising 25% by weight $NH_4OH$, 25% by weight $H_2O_2$ and 50% by weight deionized water. This etchant etches through the wafer layer 22 at a rate of approximately 2.5 microns per 15 seconds. The etching is continued down to and slightly into the epitaxial layer 21. The etching is monitored by periodically removing the wafer from the etchant and applying voltages between the anode and cathode electrodes 25' and 25'' and observing the breakdown voltage. When the breakdown voltage increases to approximately 35 to 50 volts the etching is stopped.

Sputtered or pyrolytically grown oxide films, such as $SiO_2$, $Al_2O_3$ or $BeO$, are applied in the channel area 30 to reduce high field breakdown between the closely spaced anode and cathode electrode structures 25' and 25''. The frequency of the Gunn device is determined by the spacing D between anode and cathode electrode structures.

As an alternative to chemical etching of the channel structure 30, particularly when the device is to be utilized in the high frequency range, as of 35 to 60 GHz, the channel 30 is preferably formed by RF sputter etching.

The advantage of the Gunn device shown in FIG. 5 is that the barrier layer 19 prevents unwanted leakage current. In addition, the electrode structure for both anode 25' and cathode 25'' includes the original N+ wafer layer 22 which provides a smooth drop in the carrier concentration level between the N+ layer 22 and the epitaxial N— layer 21, whereby anode and cathode efficiency are improved. Also the barrier layer 19 serves to prevent metal migration from the contact layer 23 into the active N— epitaxial layer 21. Further, it serves as a heat sink between the active device and its mount. The beryllia layer 19 has approximately the same coefficient of thermal expansion as that of gallium arsenide from 0 to 200°C. Therefore, it is thermally compatible with the gallium arsenide liquid epitaxy layer 21.

Although, as thus far described, the method of the present invention has been described for fabrication of a gallium arsenide Gunn effect device, the method is also applicable to fabrication of other lateral semiconductive devices such as Impatt or Trapatt transit time microwave source devices. Such devices are particularly useful for providing microwave power in the range of 1 to 5 watts in the frequency range of 2 to 60 GHz. Also, as an alternative to the use of gallium arsenide, indium phosphide may be used. In addition, the geometry of the electrodes 25' and 25'' and their underlying layers 24 and 22 as well as channel 30 need not be rectilinear but may be concentric with, for example, the cathode surrounding the anode.

While the foregoing description contains many specificities, these should not be construed as limitations upon the scope of the invention, but merely as an indication of several preferred embodiments thereof; the true scope of the invention is indicated by the subject matter of the appended claims and their legal equivalents.

What is claimed is:

1. In a method for fabricating a lateral type semiconductive device the steps of:
   on an N+ type semiconductive wafer of sufficient thickness to be self-supporting, growing a thin N— type epitaxial layer of semiconductive material having a substantially lower N— type carrier concentration than said wafer,
   depositing a barrier layer of electrically insulative material on said epitaxial material,
   removing a layer of the wafer material from the side opposite said barrier layer, leaving a substantially thinned wafer, the composite of said thinned wafer, said epitaxial layer and said barrier layer being of sufficient thickness to be self-supporting depositing a layer of electrode material overlaying said wafer layer for making ohmic contact thereto; and
   selectively removing areas of said layers of said electrode material and wafer material to define a pair of laterally spaced electrodes each making electrical connection to said epitaxially grown layer via an intervening layer of said wafer material.

2. The method of claim 1 wherein said wafer and epitaxial materials are selected from the class consisting of gallium arsenide and indium phosphide.

3. The method of claim 1 wherein said barrier layer is made of beryllia.

4. The method of claim 1 wherein said layer of electrode material comprises a layer of gold making electrical contact to said underlaying wafer material via an intervening layer of gold and germanium.

5. The method of claim 1 wherein said epitaxial layer is of insufficient thickness to be self-supporting.

6. The method of claim 1 wherein said epitaxial layer is between 0.20 and 50 microns thick.

7. The method of claim 1 wherein said thinned wafer is thinner than said epitaxial layer.

8. The method of claim 1 including the step of depositing a layer of metal overlaying and interfacing with said barrier layer.

9. The method of claim 8 wherein said metal comprises gold.

* * * * *